US010094020B2

(12) United States Patent
Stassen et al.

(10) Patent No.: US 10,094,020 B2
(45) Date of Patent: Oct. 9, 2018

(54) METHOD OF PRODUCING A THIN METAL-ORGANIC FRAMEWORK FILM USING VAPOR PHASE PRECURSORS

(71) Applicants: IMEC VZW, Leuven (BE); Katholieke Universiteit Leuven, KU LEUVEN R&D, Leuven (BE)

(72) Inventors: Ivo Stassen, Leuven (BE); Rob Ameloot, Diepenbeek (BE); Dirk De Vos, Holsbeek (BE); Philippe M. Vereecken, Luik (BE)

(73) Assignees: IMEC VZW, Leuven (BE); Katholieke Universiteit Leuven, KU LEUVEN R&D, Leuven (BE)

( * ) Notice: Subject to any disclaimer, the term of this patent is extended or adjusted under 35 U.S.C. 154(b) by 71 days.

(21) Appl. No.: 15/304,850

(22) PCT Filed: Apr. 29, 2015

(86) PCT No.: PCT/EP2015/059435
§ 371 (c)(1),
(2) Date: Oct. 17, 2016

(87) PCT Pub. No.: WO2015/166015
PCT Pub. Date: Nov. 5, 2015

(65) Prior Publication Data
US 2017/0198393 A1 Jul. 13, 2017

(30) Foreign Application Priority Data

Apr. 30, 2014 (EP) ..................................... 14166700

(51) Int. Cl.
*C23C 16/40* (2006.01)
*C23C 16/455* (2006.01)
*H01L 21/02* (2006.01)
*C23C 16/44* (2006.01)

(52) U.S. Cl.
CPC ...... *C23C 16/45553* (2013.01); *C23C 16/407* (2013.01); *C23C 16/4408* (2013.01); *C23C 16/4554* (2013.01); *C23C 16/45523* (2013.01); *C23C 16/45527* (2013.01); *H01L 21/0228* (2013.01); *H01L 21/02172* (2013.01); *H01L 21/02203* (2013.01); *H01L 21/02271* (2013.01)

(58) Field of Classification Search
CPC ........ C23C 16/45553; C23C 16/45527; C23C 16/4408; C23C 16/4554; H01L 21/0228; H01L 21/02172; H01L 21/02203
USPC ..................................................... 428/411.1
See application file for complete search history.

(56) References Cited

PUBLICATIONS

Dameron et al. "Molecular Layer Deposition of Alucone Polymer Films Using Trimethylaluminum and Ethylene Glycol", J. Am. Chem. Soc., Chem. Mater. 2008, 20, 3315-3326.*
Lee et al. "Rapid Vapor-Phase Fabrication of Organic-Inorganic Hybrid Superlattices with Monolayer Precision", J. Am. Chem. Soc. 2007, 129, 16034-16041.*
Lee et al. "Molecular layer deposition of ZrO2-based organic-inorganic nanohybrid thin films for organic thin film transistors", Thin Solid Films, 517 (2009), 4056-4060.*
Yoon et al. "Molecular Layer Deposition of Hybrid Organic-Inorganic Polymer Films using Diethylzinc and Ethylene Glycol", Chem. Vap. Deposition, 2009, 15, 112-121.*
Dameron et al. "Molecular Layer Deposition of Alucone Polymer Films Using Trimethylaluminum and Ethylene Glycol", J. Am. Chem. Soc., Chem. Mater. 2008, 20, 3315-3326 ... (Year: 2008).*
Lee et al. "Rapid Vapor-Phase Fabrication of Organic-Inorganic Hybrid Superlattices with Monolayer Precision", J. Am. Chem. Soc. 2007, 129, 16034-16041. (Year: 2007).*
Lu, Guang et al., "Metal-Organic Frameworks as Sensors: A ZIF-8 Based Fabry-Perot Device as a Selective Sensor for Chemical Vapors and Gases", J. Am Chem. Soc, vol. 132, No. 23, 2010, pp. 7832-7833.
Shekhah, Osama et al., "The Liquid Phase Epitaxy Approach for the Successful Construction of Ultra-Thin and Defect-Free ZIF-8 Membranes: Pure and Mixed Gas Transport Study", Chem. Commun., vol. 50, 2014, pp. 2089-2092.
Dameron, A.A., "Molecular Layer Deposition of Alucone Polymer Films Using Trimethylaluminum and Ethylene Glycol", Chemistry of Materials, vol. 20, No. 10, May 1, 2008, pp. 3315-3326.
Lee, Byoung H. et al., "Rapid Vapor-Phase Fabrication of Organic-Inorganic Hybrid Superlattices with Monolayer Precision", Journal of the American Chemical Society, vol. 129, No. 51, Dec. 1, 2007, pp. 16034-16041.
Lee, Byoung H. et al., "Molecular Layer Deposition of ZrO2-Based Organic-Inorganic Nanohybrid Thin Films for Organic Thin Film Transistors", Thin Solid Films, vol. 517, No. 14, May 29, 2009, pp. 4056-4060.
Yoon, Byunghoon et al., "Molecular Layer Deposition of Hybrid Organic-Inorganic Polymer Films Using Diethylzinc and Ethylene Glycol", Chemical Vapor Deposition, vol. 15, No. 4/5/6, Jun. 1, 2009, pp. 112-121.
George, Steven M. et al., "Surface Chemistry for Molecular Layer Deposition of Organic and Hybrid Organic-Inorganic Polymers", Accounts of Chemical Research, vol. 42, No. 4, Apr. 21, 2009, pp. 498-508.
Stassen, Ivo et al., "Solvent-Free Synthesis of Supported ZIF-8 Films and Patterns Through Transformation of Deposited Zinc Oxide Precursors", CrystEngComm, vol. 15, No. 45, Jan. 1, 2013, pp. 9308-9311.

(Continued)

*Primary Examiner* — Michael Bernshteyn
(74) *Attorney, Agent, or Firm* — McDonnell Boehnen Hulbert & Berghoff LLP

(57) ABSTRACT

A method of producing a metal-organic framework (MOF) film on a substrate is disclosed, the method comprising providing a substrate having a main surface and forming on said main surface a MOF film using an organometallic compound precursor and at least one organic ligand, wherein each of said organometallic compound precursor and said at least one organic ligand is provided only in vapour phase.

19 Claims, 9 Drawing Sheets

(56) References Cited

PUBLICATIONS

PCT International Search Report and Written Opinion, PCT International Application No. PCT/EP2015/059435, dated Jul. 7, 2015, 14 pages.

Eddaoudi, et al., "The Liquid Phase Epitaxy Approach for the Successful Construction of Ultra-Thin and Defect-Free ZIF-8 Membranes: Pure and Mixed Gas Transport Study", Chem. Commun. (Camb), Feb. 28, 2014, vol. 50(17), pp. 2089-2092, doi:10.1039/c3cc47495j, Epub Jan. 21, 2014.

Park, et al., "Exceptional Chemical and Thermal Stability of Zeolitic Imidazolate Frameworks", Proceedings of the National Academy of Sciences, Jul. 5, 2006, vol. 103(27), pp. 10186-10191, doi.org/10.1073/pnas.0602439103.

\* cited by examiner

| experiment | 1 | 2 |
| --- | --- | --- |
| ZnO substrate thickness (nm) | ± 25 | ± 320 |
| Ligand | 2-methylimidazole | 4,5-dichloroimidazole |
| MOF type | ZIF-8 | ZIF-71 |
| MOF resulting film thickness (nm) | ± 213 | ± 133 |
| Non-reacted ZnO thickness (nm) | Not visible | ± 177 |
| Full conversion | Yes | No |
| Temperature of one step solid-vapour phase deposition step (°C) | 140 | 170 |
| Reaction time (min.) | 2 | 1200 |

Figure 7

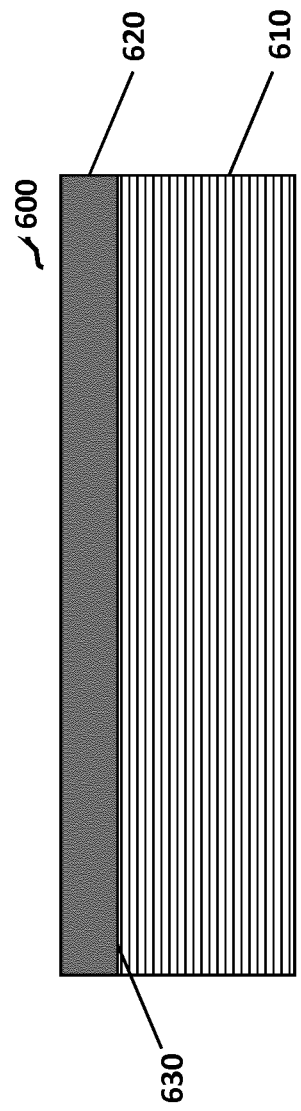
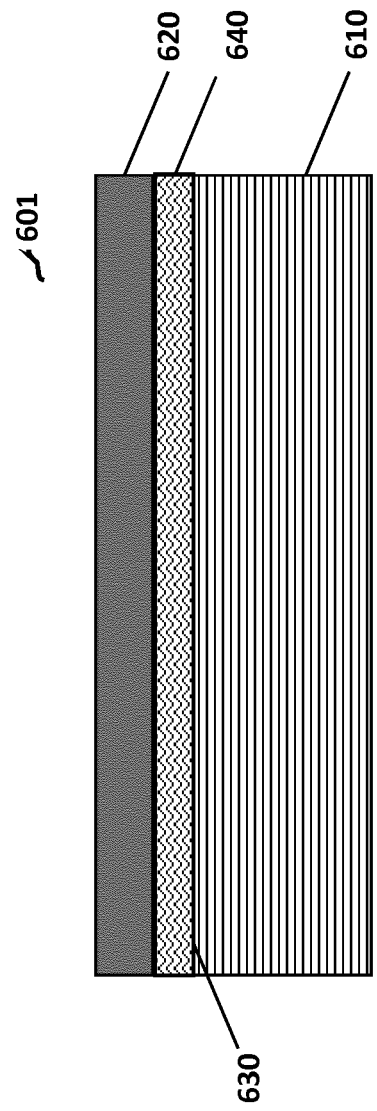
Figure 8(a)
Figure 8(b)

METHOD OF PRODUCING A THIN METAL-ORGANIC FRAMEWORK FILM USING VAPOR PHASE PRECURSORS

CROSS-REFERENCE

This application is a section 371 of International application no. PCT/EP2015/059435, filed Apr. 29, 2015 which claims priority from EP Patent application no. 14166700.6, filed Apr. 30, 2014, which is incorporated by reference in its entirety.

FIELD OF THE INVENTION

The present invention is related to the field of producing metal-organic framework films. More specifically, it is related to a method of producing a thin metal-organic framework film on a substrate using vapor phase precursors. The present invention also relates to a substrate structure comprising a metal-organic framework film obtained thereby.

BACKGROUND OF THE INVENTION

Metal-organic framework (MOF) materials are a class of hybrid organic-inorganic crystalline porous materials consisting of metal ions or a cluster of metal ions connected by multi-topic organic linkers. MOF films have received great interest in the last couple of years in the field of separations, catalysis, sensing, gas storage, biomedical applications or as low-k materials in semiconductor industry, due to their tunable pore sizes and the ease of functionalization of the internal surfaces.

Understanding film processing methods such as, deposition and patterning, are key in order to further explore the potential use of these materials. Deposition of MOF films has been commonly reported to be based on growth from a solution in which the organic linker and the metal salt, providing the metal ions, are dissolved.

The deposition can take place by immersing the substrate, onto which MOF film will be grown, into a solvent-based solution containing also the dissolved organic linker and dissolved metal salt as reported by Lu and Hupp, *Journal of American Chemical Society*, 132(23), 7832-7833, (2010).

The deposition can also take place by immersing the substrate sequentially into a solution containing the dissolved linker and then into a solution containing the dissolved metal salt, while after each immersing step the substrate is washed with the solvent as reported by Eddaoudi et. al., *Chem. Commun.*, 2014,50, 2089-2092.

These deposition techniques are not self-limiting, thereby requiring high number of cycles to be completed, before obtaining a homogeneous and a defect-free film. The thickness and the deposition time of films obtained through these aforementioned methods may hinder the applicability of these growth methods in various fields, where, for example, faster deposition times are desired to obtain thinner MOF films. For example, a growth rate of 100 nm/30 min is given in the work of Lu and Hupp, where they have used a methanolic solvent-based solution and zinc nitrate ($Zn(NO3)_2$) in order to produce ZIF-8, which is a type of MOF. In the work of Eddaoudi et. al. a film thickness of 0.5 micron to 1.6 micron obtained after 150 and 300 growth cycles, where they report the use of metal ion solution and a solvent-based ($CH_3OH$) solution also for the production of ZIF-8. Additionally, these deposition techniques involve the use of a large amount of solvent-based solution, which is usually toxic. Furthermore, they involve the use of chloride and nitrate salts, which are commonly used as sources of metal ions, which are not compatible with industrial requirements due to corrosion and safety hazards.

The problems associated with the use of a solvent-based solution and the use of metal salts have been overcome in the art by producing MOF films from metal oxides or hydroxides. For example, in the work of Stassen et. al. (Cryst. Eng. Comm., 15, 9308-9311, 2013), formation of ZIF-8,which is a type of MOF film, is reported in the absence of a solvent-based solution. Starting ZnO is sputtered on a surface. However, the organic linker, which is 2-methylimidazole, is applied as a powder over the surface containing the metal oxide in this technique. This can pose a limitation to the use of this technique in certain industries, for example semiconductor industry, due to the fact that the use of powders is strictly forbidden within the manufacturing environment.

There is, therefore, a need in the art, to produce thin MOF films using a method that is applicable to a wider range of industries.

SUMMARY OF THE INVENTION

The invention is related to methods and device as disclosed in the appended claims.

It is an object of embodiments of the present invention to provide methods for producing a metal-organic framework (MOF) film on a substrate.

The above objective is accomplished by a method according to the present invention.

In a first aspect, the present invention relates to a method for producing a MOF film on a substrate. The method comprises providing a substrate having a main surface. A MOF film is formed on this main surface using an organometallic compound precursor, selected to form an organometallic compound, and at least one organic ligand. Each of the organometallic compound precursor and the at least one organic ligand is provided in vapor phase.

The inventors have found out that using each of the organometallic compound precursor and the at least one organic ligand in vapor phase results in producing a MOF film in a more compatible way with industrial requirements. Furthermore, it makes the production of MOF film suitable for wider fields of technology opening opportunities for other uses.

The inventors have further observed that producing a MOF film according to embodiments of the present invention is self-limiting. Consequently, it does not require high number of reaction cycles to obtain a homogeneous and pin-hole free film. Obtaining a MOF film that is homogeneous and pin-hole free is advantageous.

Obtaining a homogeneous MOF film leads to a less geometric variation in film properties and performance. This also makes the film more suitable for integration in multilayer stacks.

A MOF film integrated in a multilayer stack is able to separate two layers from each other. For example, it may act as an insulator between two conducting layers. Thus, in such a case, having a pin-hole free MOF film leads to the absence of short circuits.

The inventors have further observed that producing a MOF film according to embodiments of the present invention leads to the formation of a conformal thin MOF film. Forming a conformal thin MOF film, which may be as thin as 20 nm is advantageous since this facilitates homogeneous coverage of three dimensional features at such thicknesses.

In an embodiment, this main surface of this substrate comprises a plurality of protrusions or a plurality of indentations. These protrusions refer to structures protruding from the substrate either in a free-standing manner or connected manner. These protrusions may have any geometrical three-dimensional shape such as for example pillar, cone, pyramid, sphere, half sphere, cube and alike. It is advantageous to have plurality of protrusions or indentations on the main surface of the substrate. Producing a MOF film on a substrate with a main surface having plurality of protrusions or a plurality of indentations enables the making of enhanced sensitivity for sensors, enhanced accessibility and thus reaction kinetics for (photo-)catalysis and (photo-)electrochemical cells due to increased surface area.

These protrusions may be obtained by processing the substrate using methods known to persons skilled in the art such that these protrusions are of the same material as of the substrate. These protrusions may also be of a different material than that of the substrate. These protrusions may be pillars, metal nanowires, semiconductor nanowires, carbon nanotubes or carbon nano-sheets. These metal nanowires may be produced by plating into porous templates. These semiconductor nanowires may be produced by bottom-up catalytic vapor-liquid-solid growth or by catalytic etching.

In embodiments, this substrate may be any type of substrate having a main surface suitable for forming a MOF film.

In an embodiment, this substrate is a Si substrate.

In an embodiment, this substrate is a bulk Si substrate.

In embodiments, this main surface of this substrate may be covered with a layer of a dielectric material. This layer of this dielectric material may be provided by a deposition method. In preferred embodiments, this layer of this dielectric material is deposited by Atomic Layer Deposition (ALD). It is advantageous to deposit this dielectric material by ALD. This dielectric material deposited by ALD is a conformal layer and follows the topography defined by these protrusions or indentations of the main surface of the substrate.

In embodiments, this dielectric layer may comprise, for example, an oxide layer. This oxide layer may be any metal oxide that can be deposited by ALD.

The inventors have found out that providing a main surface covered with a conformal layer of a dielectric material is advantageous since this layer provides good adhesion between the substrate and the MOF film that is produced on the substrate.

In preferred embodiments, this oxide layer may be $TiO_2$, $SiO_2$ or $Al_2O_3$. In more preferred embodiments, this oxide layer is $TiO_2$.

The inventors have found out that the presence of $TiO_2$, as the adhesion layer, on this main surface of this substrate leads to the formation of a continuous MOF film.

The thickness of this oxide layer is in the range of 2 nm to 40 nm.

In a method according to embodiments of the present invention, forming this MOF film comprises at least a cyclic reaction sequence repeated for a first predetermined number of cycle times. According to particular embodiments, the method further comprises initiating this cyclic reaction sequence by exposing this main surface to this organometallic compound precursor, thereby depositing this organometallic compound on the exposed surface.

In a method according to embodiments of the present invention, this first predetermined number of cycle times is between 1 to 100. In preferred embodiments, this first predetermined number of cycle times is between 1 to 20. In more preferred embodiments, this first predetermined number of cycle times is between 1 to 15. In even more preferred embodiments, this first predetermined number of cycle times is between 1 to 5.

It is an advantage of the embodiments of the present invention that this preferred and even more preferred first predetermined number of cycle times leads to the formation of a continuous and pin-hole free MOF film.

In an embodiment of the present invention, this cyclic reaction sequence uses a Molecular Layer Deposition (MLD) process. This cyclic reaction sequence comprises performing a first purge step. This first purge step cleans the reaction chamber from excess of unreacted organometallic compound precursor, which initiated this cyclic reaction sequence.

After this first purge step, the exposed main surface is subjected to this at least one organic ligand. After this subjection step, a second purge step is performed to clean the reaction chamber from excess of unreacted organic ligand.

In an embodiment, this first purge step and this second purge step can be both performed by a flow of inert gas such as $N_2$ or Ar or He.

In an alternative embodiment, this first purge step and this second purge step can also be performed by evacuating the chamber.

In an embodiment, the exposed main surface may be subjected to more than one organic ligand after this first step and before this second purge step. These more than organic ligand may be provided to the exposed main surface in the form of a vapour mixture.

In an alternative embodiment, each of said more than one organic ligand may be provided to the exposed main surface in subsequent cycles of this cyclic reaction sequence.

In an alternative embodiment of the present invention, this cyclic reaction sequence is done using an Atomic layer Deposition (ALD) process. This cyclic reaction sequence, when ALD is used, comprises performing a first purge step. This first purge step cleans the reaction chamber from excess of unreacted organometallic compound precursor, which initiated this cyclic reaction sequence. After this first purge step, the exposed main surface is subjected to an oxidizing agent thereby forming a metal oxide on this substrate. This oxidizing agent may be water vapor. After this step, a second purge step is performed to clean the reaction chamber from excess of oxidizing agent. The method further comprises, after performing this cyclic reaction sequence using ALD, subjecting this metal oxide to this at least one organic ligand for a predetermined duration that involves a one-step solid vapor deposition process, to thereby convert this metal oxide at least partially into said MOF film.

In an embodiment, this predetermined duration is determined such that full conversion of this metal oxide into this MOF film is provided.

In an alternative embodiment, this predetermined duration is determined such that partial conversion of this metal oxide into this MOF film is provided.

In an embodiment, this metal oxide is zinc oxide (ZnO).

In an alternative embodiment of the present invention, this metal oxide may be provided, ex-situ, on this main surface of this substrate by sputtering, physical vapor deposition (PVD) or electrochemical deposition (ECD).

In another alternative embodiment of the present invention, this metal oxide may be provided by first providing this metal on this main surface of this substrate and then performing a thermal oxidation of this metal to, thereby, form this metal oxide.

In an embodiment, this cyclic reaction sequence of forming this metal oxide using ALD and the subsequent subjection of this metal oxide to this at least one organic ligand is repeated for a second predetermined number of cycle times. This is advantageous such that a MOF film up to any desired thickness may be obtained.

In embodiments of the present invention, this organometallic compound precursor comprises a metal ion or a cluster of metal ions. This cluster of metal ions can be selected from a group consisting of Zn, Fe, In, Co, Cu, Mn, Li, B, Cd, Hg and Pr. In an embodiment this group may further consist of Mg, Al, Zr, Hf, Ti and Ta.

In a preferred embodiment, this metal ion is Zn ion.

In embodiments of the present invention, this at least one organic ligand is azole-based.

In preferred embodiments, this azole-based organic ligand is [2-methylimidazole], [3-(2-Pyridyl)-5-(4-pyridyl_-1,2,4-triazole] or [4,5-dichloroimidazole]. [2-methylimidazole] is used for producing a MOF film called ZIF-8. [3-(2-Pyridyl)-5-(4-pyridyl_-1,2,4-triazole] is used for producing a MOF film called MAF-28. [4,5-dichloroimidazole] is used for producing a MOF film called ZIF -71.

In more preferred embodiments, this azole-based organic ligand is [2-methylimidazole] and is used for producing a ZIF-8 film.

In a second aspect, the present invention relates to a substrate structure. This substrate structure comprises a substrate having a main surface and a MOF film on said main surface. This MOF film has a thickness in the range of 1 nm to 250 nm and is pin-hole free. This substrate structure may be an intermediate structure obtained as the result of the embodiments of the present invention.

In an embodiment of the second aspect, this substrate has a main surface comprising a plurality of protrusions or a plurality of indentations. These protrusions refer to structures protruding from the substrate either in a free-standing manner or connected manner. These protrusions may have any geometrical three-dimensional shape such as for example pillar, cone, pyramid, sphere, half sphere, cube and alike.

These protrusions may be of the same material as of the substrate. These protrusions may also be of a different material than that of the substrate. These protrusions may be pillars, metal nanowires, semiconductor nanowires, carbon nanotubes or carbon nano-sheets. These metal nanowires may be produced by plating into porous templates. These semiconductor nanowires may be produced by bottom-up catalytic vapor-liquid-solid growth or by catalytic etching.

In an embodiment, these protrusions are free-standing, they are part of this substrate and they protrude from this substrate.

In an embodiment of the second aspect, this main surface of this substrate is covered with a conformal layer of a dielectric material.

In embodiments, this conformal layer of dielectric material may comprise, for example, an oxide layer. This oxide layer may be an electrical insulator. This oxide layer may be an electrical conductor. This oxide layer may also be an ionic conductor.

In preferred embodiments, this oxide layer may be $TiO_2$, $SiO_2$ or $Al_2O_3$. In more preferred embodiments, this oxide layer is $TiO_2$. The thickness of this oxide layer is in the range of 2 nm to 40 nm.

In an embodiment, this substrate structure further comprises a stack. This stack consists of layers of MOF films and layers of materials having a refractive index higher than 1.4. Each layer of MOF films in this stack is produced according to the embodiments of the method disclosed. A substrate structure comprising this stack is advantageous for optical sensing since each layer of MOF film is continuous.

In a third aspect of the present invention, use of an organometallic compound precursor and at least one organic ligand for producing a metal organic framework (MOF) film on a main surface of a substrate is disclosed, wherein each of said organometallic compound precursor and said at least one organic ligand is provided in vapor phase.

BRIEF DESCRIPTION OF THE FIGURES

FIG. 7 is a table with respect to experimental details of producing the two exemplary MOF films of FIG. 4.

FIG. 8 shows a substrate structure comprising a MOF film according to embodiments of this invention (a) without conformal layer of a dielectric material (adhesion layer) and (b) with conformal layer of a dielectric material (adhesion layer). The drawings are only schematic and are non-limiting. Any reference signs in the claims shall not be construed as limiting the scope.

Figure 1:
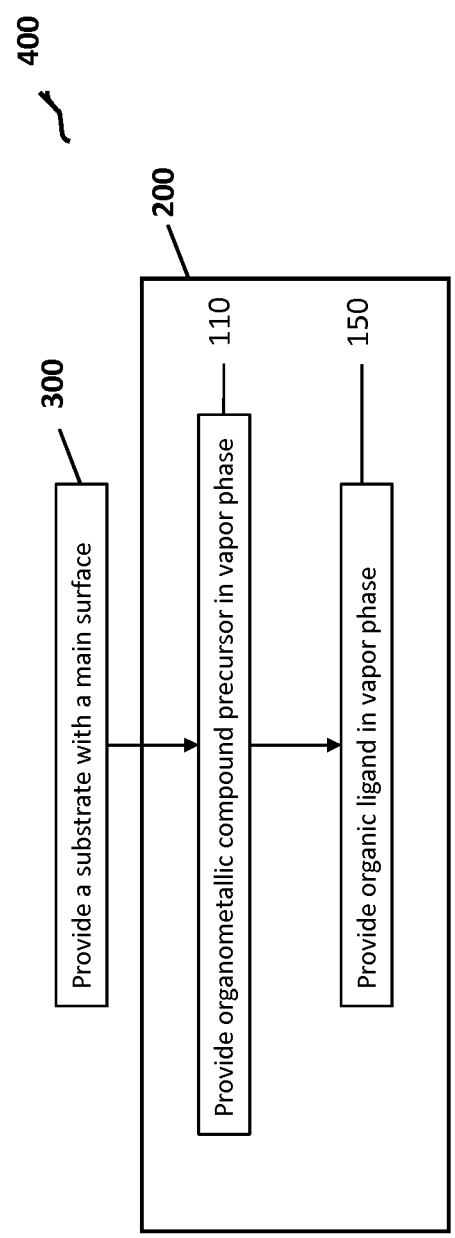
FIG. 1 is a flowchart representing a method according to embodiments of the present invention.

In the different drawings, the same reference signs refer to the same or analogous elements. In the drawings, the size of the elements may be exaggerated and not drawn on scale for illustrative purposes. The dimensions and the relative dimensions do not correspond to actual reductions or practice of the invention.

DETAILED DESCRIPTION OF THE INVENTION

The present invention will be described with respect to particular embodiments and with reference to certain drawings but the invention is not limited thereto but only by the claims. The drawings described are only schematic and are non-limiting.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

The following terms are provided solely to aid in the understanding of the invention.

As used herein and unless provided otherwise, the term "cyclic reaction sequence" refers to a chemical reaction leading to the formation of a film, wherein precursors are introduced into the reaction chamber sequentially and wherein introduction of each precursor is followed by a purge step, thereby forming a cyclic reaction sequence. The cyclic reaction sequence repeated for a predetermined number of times determines the thickness of the film.

As used herein and unless provided otherwise, the term "purge step" refers to the removal of excess material and reaction products from the reaction chamber.

As used herein and unless provided otherwise, the term "pin-hole" refers to a hole that might protrude through the thickness of the layer that it is present.

As used herein and unless provided otherwise, the term "pin-hole free" refers to the condition, where there are no pin-holes in the layer.

As used herein and unless provided otherwise, the term "self-limiting" refers to a reaction that stops after all available sites on a surface have reacted such that after this point no further material is deposited on that surface until the other reactive agent is supplied into the deposition chamber.

As used herein and unless provided otherwise, the term "homogeneous" refers to the root mean square (RMS) roughness of the film being less than 10% of the thickness of the film.

As used herein and unless provided otherwise, the term "metal-organic framework (MOF)" refers to porous compounds consisting of metal ions or cluster of metal ions coordinated to organic ligands with more than one coordinating group. Typically, the structure and hence the properties of the MOF are dictated by the choice of metal and the organic ligand. Furthermore, the size and shape of pores are influenced by the metal's coordination number dictated by the number of organic ligands that can bind to the metal and the orientation of the organic ligands.

As used herein and unless provided otherwise, the term "coordination number" is defined as the total number of neighbours of a central atom in a molecule or ion.

As used herein and unless provided otherwise, the term "continuous film" refers to a film that is uninterrupted on the surface where it is formed.

As used herein and unless provided otherwise, the term "protrusions" refer to structures protruding from the substrate either in a free-standing manner or connected manner. These protrusions may have any geometrical three dimensional shape such as for example pillar, cone, pyramid, sphere, half sphere, cube and alike.

As used herein and unless provided otherwise, the term "indentations" refer to any type of recess made in the substrate either in a connected or disconnected manner such for example, trench, cavity and alike or openings having irregular and/or regular geometries.

Preferably, the organic ligands that are present in the structure of MOFs are chosen from the class of bidentate carboxylics, tridentate carboxylates and heterocyclic compounds containing nitrogen or sulphur or oxygen or combinations thereof. Preferably, the organic ligand used in the context of the present invention is chosen from the class of heterocyclic compounds containing nitrogen or sulphur or oxygen or combinations thereof. More preferably, the heterocyclic compound containing nitrogen or sulphur or oxygen or combinations thereof is a five-membered heterocyclic compound. Yet more preferably, the 5 membered heterocyclic compound is an azole and the organic ligand is referred to as being "azole-based" in the context of this invention. Azole-based MOFs are further classified as being "zeolitic metal azolate framework (MAF)", "zeolitic imidazolate framework (ZIF)", "boron imidazolate framework (BIF) and "tetrahedral imidazolate framework (TIF)". More preferably, azole-based MOFs used in the context of the present invention is a MAF or a ZIF. In preferred embodiments, the ZIF is a ZIF-8 or ZIF-71 and the MAF is a MAF-28. ZIF-8 is produced using [2-methylimidazole] as the organic ligand. MAF-28 is produced using [3-(2-Pyridyl)-5-(4-pyridyl_-1, 2,4-triazole] as the organic ligand. ZIF-71 is produced using 4,5-dichloroimidazole as the organic ligand.

As used herein and unless provided otherwise, the term "oxidizing agent" refers to an element or compound in an oxidation-reduction reaction that accepts an electron from another species. Preferably, the oxidizing agent used in the context of the present invention is oxygen plasma, ozone or water.

As used herein and unless provided otherwise, the term "organometallic compound" refers to a compound containing at least one metal-to-carbon bond, in which carbon is part of an organic group. The metal in said metal-to-carbon bond used in the context of the present invention is chosen from any metal that is available as organometallic compound and that is suitable to produce a MOF film by using Atomic Layer Deposition (ALD) process or Molecular Layer Deposition (MLD) process. Preferably, said at least one metal can be chosen from the group comprising Zn, Fe, In, Co, Cu, Mg, Li, B, Cd, Hg, Al, Pr, Ta, La, Ce, Ir, Rh, Sn, Sb, Bi, Pb, Y, Ca, Sr, Ba, Ti, Zr, Hf, V, Cr, Mo, W, Mn, Na and K. Preferably, said at least one metal is chosen from the group comprising Zn, Fe, In, Co, Cu, Mn, Li, B, Cd, Hg, Mg, Al, Zr, Hf, Ti, Ta and Pr. More preferably, said at least one metal is Zn.

As used herein and unless provided otherwise, the term "gas flow mode" refers to the condition when precursor gases are introduced continuously into and extracted from the reaction chamber while maintaining the pre-determined total gas pressure or the pre-determined partial gas pressures in the reaction chamber.

As used herein and unless provided otherwise, the term "flooded mode" refers to the condition when precursor gases are introduced in the reaction chamber until condition of pre-determined total gas pressure or pre-determined partial gas pressures is achieved and furthermore, the reaction chamber is kept under this condition for a pre-determined duration of time. Flooded mode is typically used when long exposure times are needed. Long exposure times can refer to exposure times varying from few seconds up to several minutes or even up to half an hour.

As used herein and unless provided otherwise, the term "full conversion" refers to the conversion of a layer having certain materials properties to another layer having different materials properties.

As used herein and unless provided otherwise, the term "partial conversion" or "partially converting" refers to the conversion of an initial layer having initial materials properties to another layer having materials properties different than the initial materials properties and still having a remaining portion of the initial layer with those initial materials properties.

The invention will now be described by a detailed description of several embodiments of the invention. It is clear that other embodiments of the invention can be configured according to the knowledge of persons skilled in the art without departing from the technical teaching of the invention, the invention being limited only by the terms of the appended claims.

FIG. 1 is a flowchart representing in general steps a method (400) for producing a MOF film (200) according to embodiments of the present invention. A method according to embodiments of the present invention starts with providing a substrate having a main surface (300). The substrate can be a semiconductor substrate, a metal substrate, a glass substrate or an silicon on insulator (SOI) substrate.

The main surface of the substrate may be covered with a conformal layer of a dielectric material. This layer of the dielectric material may be provided by a deposition method. Preferably, this layer of the dielectric material is deposited by Atomic Layer Deposition (ALD) due to the fact that conformal deposition can be obtained with a controlled thickness. This dielectric layer may comprise, for example, an oxide layer. This oxide layer may be any metal oxide that can be deposited by ALD. Preferably, this oxide layer may be $TiO_2$, $SiO_2$ or $Al_2O_3$. More preferably, the oxide layer is $TiO_2$. This oxide layer is an adhesion layer that provides good adhesion between the substrate and the MOF film that is formed. Furthermore, this oxide layer helps to produce a continuous MOF film. The thickness of this oxide layer (adhesion layer) is in the range of 2 nm-40 nm.

In a second step (200), a MOF film is formed. Formation of said MOF film is carried out by using an organometallic compound precursor (110) and at least one organic ligand (150), both of which are provided in vapour phase according to embodiments of the present invention. Formation of the MOF film comprises at least a cyclic reaction sequence repeated for a first predetermined number of cycle times, which is initiated by exposing the main surface to a organometallic compound precursor (110) in vapour phase.

In the context of the present invention, the first predetermined number of cycle times is between 1 to 100. Preferably, the first predetermined number of cycle times is between 1 to 20 and more preferably between 1 to 15 and even more preferably between 1 to 5.

The inventors of the present invention have realized a conformal thin MOF film, which is homogeneous and pin-hole free, by providing the organometallic compound precursor and the at least one organic ligand in vapour phase. Forming a conformal MOF film that is homogeneous and pin-hole free is advantageous because it covers the underlying layers which may be functional for example when used as an interlayer in a stack and it avoids contact between the two layers it separates.

Figure 2:
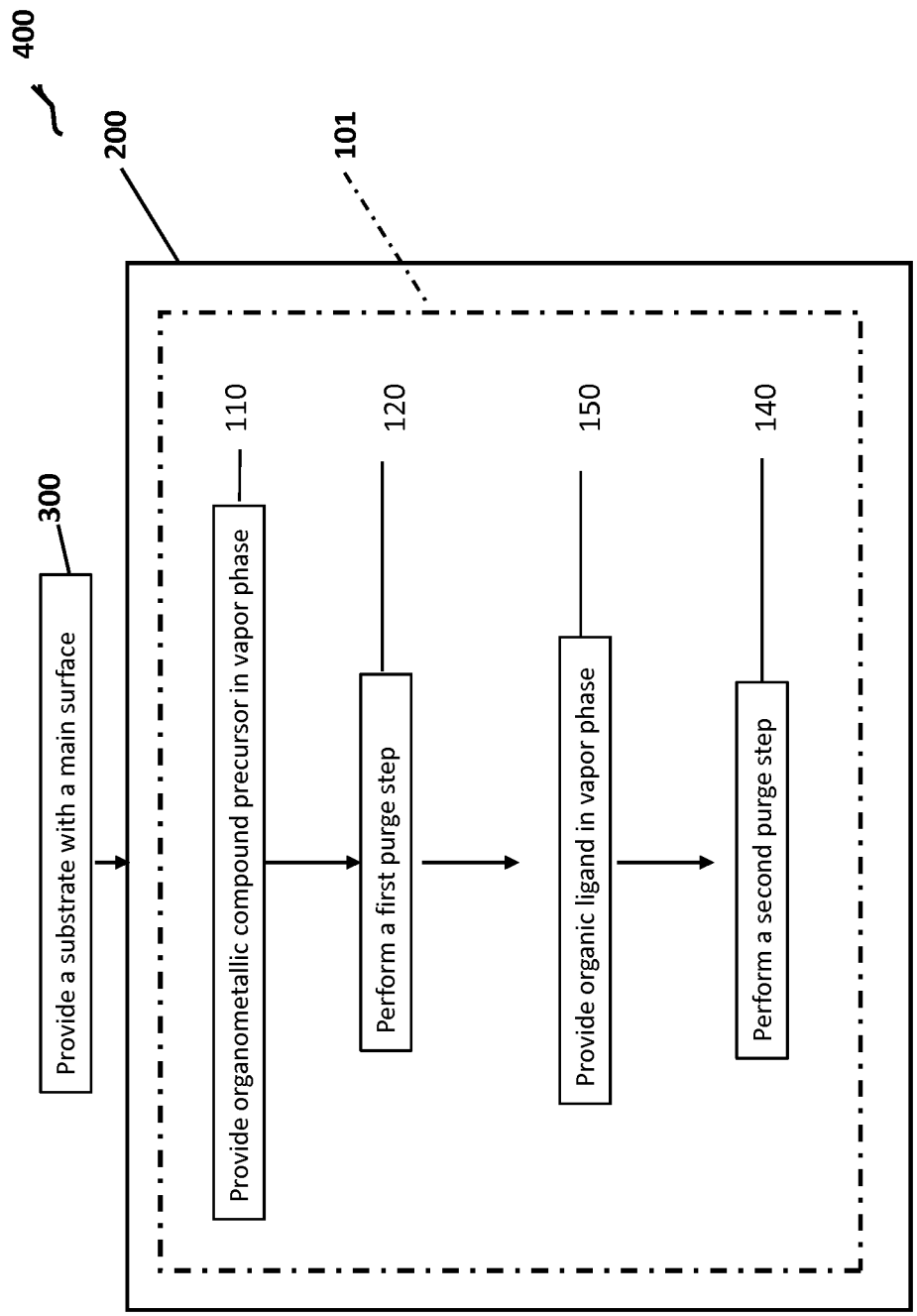
FIG. 2 is a flowchart representing a method according to particular embodiments of the present invention represented in the flowchart of FIG. 1.

In a first embodiment, MOF film is formed only through a cyclic reaction sequence (101). FIG. 2 is a flowchart illustrating method steps of a method (400) according to embodiments of the present invention. The method (400) comprises a first step (300) of providing a substrate with a main surface (630). In a second step, said MOF film (200) is formed only through a cyclic reaction sequence (101) performed by Molecular Layer Deposition (MLD) process in a reactor chamber. MLD process requires the use of suitable precursors that are volatile. These suitable precursors comprise an organometallic compound and at least one organic ligand, both provided in vapour phase. The at least one organic ligand (150) can be provided in vapour phase in gas flow mode or flooded mode.

More than one organic ligand can also be provided to produce the MOF film according to the embodiments of the present invention.

One approach is providing said more than one organic ligand in the form of a vapour mixture by step 150 shown in FIG. 2.

An alternative approach (not shown in a separate figure) is providing each of said more than one organic ligand by step 150 in subsequent cycles of the cyclic reaction sequence (101).

The main surface (630) of the substrate (610) may be pre-conditioned by providing a pre-conditioning step in order to make it suitable for the MLD process.

The type of said preconditioning step may depend on the field of the application that the MOF film will be used in or on the type of the substrate.

Said pre-conditioning step can, for example, be an oxidation step performed by using ozone or oxygen plasma.

The cyclic reaction sequence (101) is initiated by providing an organometallic compound precursor (110) in vapour phase into the reaction chamber. In a second step, a first purge (120) is performed in order to get rid of excess of the organometallic compound precursor from the reaction chamber. Subsequently, in a third step, the substrate is subjected to at least one organic ligand (150) provided in vapour phase into the reaction chamber. In the fourth step, a second purge is performed (140).

The flow rate of said organometallic compound precursor and the flow rate of said organic ligand depend on the process that is used for producing said MOF film, as appreciated by the skilled person.

The flow rate of said organometallic compound precursor and the flow rate of said organic ligand depend on the vapour pressure of the organometallic compound precursor and vapour pressure of organic the ligand.

The flow rate of said organometallic compound precursor and the flow rate of said organic ligand depend on the substrate on which said MOF film is produced, as appreciated by the skilled person.

The first purge step and the second purge step can be both performed by a flow of inert gas such as $N_2$ or Ar or He.

The first purge step and the second purge step can also be performed by evacuating the chamber.

The temperature of the substrate is in the range between 20° C.-400° C. when MLD process is used. Preferably, the temperature of the substrate is in the range between 100° C.-180° C.

The temperature of the substrate depends on the type of the organometallic compound precursor and the type of the organic ligand in order to produce the MOF film, as appreciated by the skilled person.

The reaction chamber pressure is less than or equal to 1 atmosphere.

The duration of providing the organometallic compound precursor (110) and the duration of providing the organic ligand (150) as shown in FIG. 2 can be in the range 0.1 second-10 seconds. If flooded mode is used, the duration can be longer, ranging from a few seconds up to several minutes or even up to half an hour.

The duration of the first purge step (120) and the second purge step (140) as shown in FIG. 2 can be in the range of 1 second to 30 seconds or longer than 30 seconds, for example up to 1 minute for efficient purging.

Typically, MOF film growth of about 0.05 nm to 2 nm per cycle is achieved.

The cyclic reaction sequence (101) is repeated for a first predetermined number of cycle times, thereby reaching the pre-determined thickness of the MOF film.

In a second embodiment, the MOF film is formed (200) as a result of a cyclic reaction sequence (102) combined further with a one-step solid-vapour phase deposition process (500).

Figure 3:
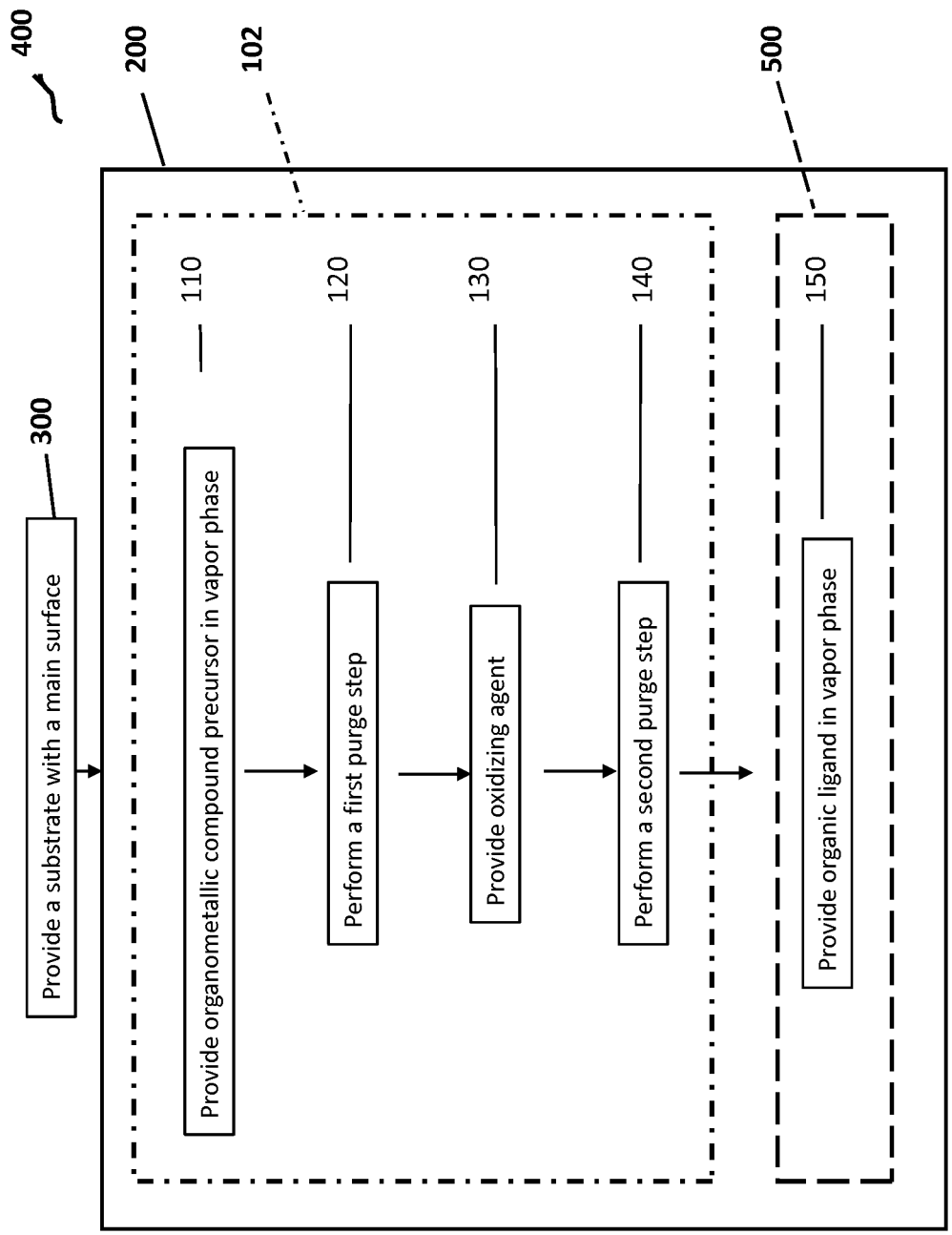
FIG. 3 is a flowchart representing a method according to particular embodiments of the present invention represented in the flowchart of FIG. 1.

FIG. 3 is a flowchart illustrating method steps of a method (400) according to embodiments of the present invention. The method (400) comprises a first step (300) of providing a substrate with a main surface (630).

The main surface of the substrate may be covered with a conformal layer of a dielectric material. This layer of this dielectric material may be provided by a deposition method. Preferably, this layer of this dielectric material is deposited by Atomic Layer Deposition (ALD) due to the fact that conformal deposition can be obtained with a controlled thickness. This dielectric layer may comprise, for example, an oxide layer. This oxide layer may be any metal oxide that can be deposited by ALD. Preferably, this oxide layer may be $TiO_2$, $SiO_2$ or $Al_2O_3$. More preferably, this oxide layer is $TiO_2$. This oxide layer is an adhesion layer that provides good adhesion between the substrate and the MOF film that is formed. Furthermore, the oxide layer helps to produce continuous MOF films. The thickness of this oxide layer (adhesion layer) is in the range of 2 nm-40 nm.

In a second step, the MOF film is produced (200). Producing the MOF film starts by forming a metal oxide on the substrate as a result of a cyclic reaction sequence (102) performed by Atomic Layer Deposition (ALD) process. Said cyclic reaction sequence is further combined with a one-step solid-vapour phase deposition process (500), thereby converting said metal oxide to MOF film. When said metal oxide is fully converted to MOF film, the oxide layer, which is the adhesion layer, provides good adhesion between the substrate and the MOF film.

The main surface (630) of the substrate may be pre-conditioned by providing a pre-conditioning step in order to make it suitable for the ALD process.

Typically, said pre-conditioning step can be an oxidation step performed by using ozone or oxygen plasma.

The cyclic reaction sequence (102) is initiated by providing an organometallic compound precursor (110) in vapour phase into the reaction chamber. In a second step of the formation of the metal oxide, a first purge (120) is performed in order to get rid of excess of the organometallic compound precursor from the reaction chamber. Following the first purge step, in a third step of the formation of the metal oxide, the substrate is subjected to an oxidizing agent (130). The oxidizing agent can be water or ozone or oxygen plasma.

In a fourth step, a second purge is performed (140).

The first purge step and the second purge step are both performed by a flow of inert gas such as $N_2$ or Ar or He.

The first purge step and the second purge step can also be performed by evacuating the chamber.

The temperature of the substrate, on which the formation of the metal oxide takes place during the ALD process, can be between 90° C.-360° C. Preferably, the temperature of the substrate on which the formation of the metal oxide takes place during ALD process is 240° C.

The pressure at which the formation of the metal oxide takes place during the ALD process is less than or equal to 1 Torr.

Duration of providing organometallic compound precursor (110) and duration of providing oxidizing agent (130) as shown in FIG. 3 can be in the range 0.1 second-10 seconds. If flooded mode is used, the duration can be longer ranging from few seconds up to several minutes or even up to half an hour.

Duration of first purge step (120) and second purge step (140) as shown in FIG. 3 can be in the range 1 second to 30 seconds or longer than 30 seconds for efficient purging.

The cyclic reaction sequence (102) is repeated for a first predetermined number of cycle times, thereby obtaining a pre-determined thickness of the metal oxide.

A one-step solid-vapour deposition (500) process is performed subsequent to the formation of the metal oxide, where the metal oxide is subjected to at least one organic ligand (150), thereby converting the metal oxide to the MOF film.

The one-step solid-vapour deposition process can be carried out in-situ in the ALD chamber, without removing the substrate from the ALD chamber, subsequent to forming the metal oxide.

Forming the metal oxide on the substrate can, alternatively, be done by sputtering, physical vapour deposition (PVD), electrochemical deposition or thermal oxidation of the metal. In this case, conversion of the metal oxide into MOF film by the one-step solid-vapour deposition process can be carried out ex-situ.

The at least one organic ligand can be provided either in gas-flow mode or flooded mode.

The one-step solid-vapour phase deposition process (500) can be performed at a substrate temperature in the range of 20° C.-400° C. Preferably, the temperature of the substrate is in the range between 100° C.-180° C.

The temperature at which the one-step solid-vapour deposition (500) is performed has influence on the extent of conversion of the thickness of the metal oxide that is obtained by ALD as a result of the cyclic reaction sequence (102). Conversion of the metal oxide to MOF film is hindered due to water vapour loss and this water loss is faster at higher temperatures. On the other hand, temperature is needed both for sufficient conversion kinetics and crystallization of the MOF film. For example, the MOF film will not be crystalline for growth temperatures lower than 80° C. In order to counteract these opposing effects, water vapour can be added into the reaction chamber during executing step (500).

The pressure of the reactor during the one-step solid-vapour phase deposition process is less than or equal to 1 atm.

There is a critical metal oxide thickness that plays a role on the conversion of the metal oxide to said MOF film. The critical metal oxide thickness is in the range of 50 nm to 150 nm. Preferably, the critical metal oxide thickness is in the range of 10 nm to 30 nm.

When the metal oxide thickness is less than the critical thickness, the duration of subjecting the metal oxide to the at least one organic ligand depends on the thickness of the metal oxide. This duration is directly proportional to the thickness of the metal oxide in order to achieve full conversion of the metal oxide to a MOF film.

However, by adjusting the duration of subjecting the metal oxide to said at least one organic ligand, a partial conversion of the metal oxide to a MOF film can also be achieved. Partial conversion of the metal oxide results in unconverted metal oxide to be present underlying and in contact with the MOF film formed.

When the metal oxide thickness is higher than the critical thickness, the duration of subjecting the metal oxide to the at least one organic ligand is independent of the thickness of the metal oxide. Full conversion of the metal oxide to MOF film cannot be achieved and unconverted metal oxide exists between said MOF film and the substrate.

Obtaining a partial conversion of the metal oxide to a MOF film is advantageous when no adhesion layer is present on the main surface of the substrate. Unconverted metal oxide, then acts as an adhesion layer between the substrate and the MOF film formed.

FIGS. 4a-d illustrates a comparison of two different MOF films produced on substrates having a different initial metal oxide thickness. Substrate is denoted by 610 and it is a Si substrate. Metal oxide is denoted by 650 and it is ZnO. A pre-conditioning step is performed on the Si substrate (610), thereby forming SiO$_2$ (640) on the main surface (630) of the Si substrate (610).

Figure 4:
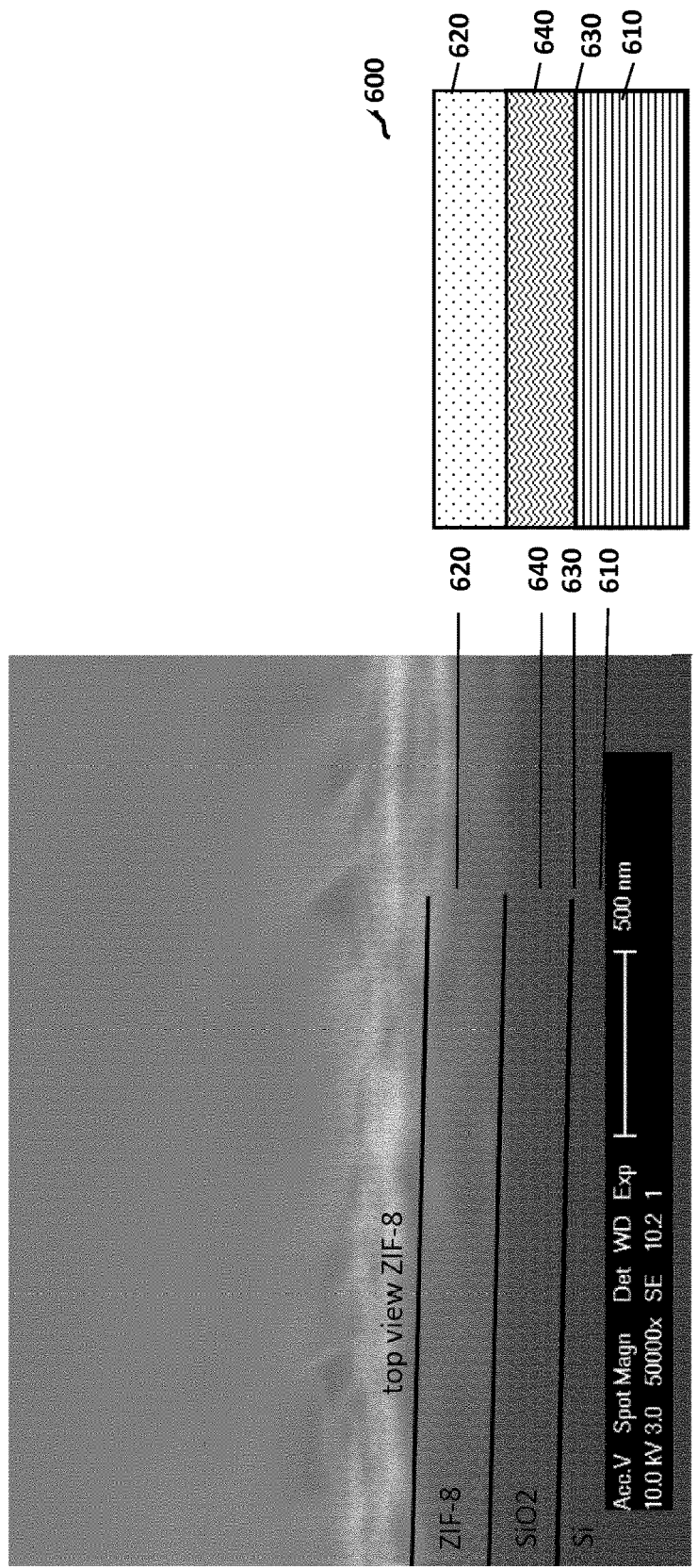
FIG. 4 is a cross section of the substrate containing MOF film. (a) cross section Scanning Electron Microscopy (SEM) image of the substrate showing ZIF-8 obtained by full conversion of ZnO, (b) schematic of a cross section of the substrate showing ZIF-8 obtained by full conversion of ZnO as shown in (a), (c) cross section Scanning Electron Microscopy (SEM) image of the substrate showing ZIF-71 obtained by partial conversion of ZnO and (d) illustration of cross section of the substrate showing ZIF-71 obtained by partial conversion of ZnO.
Figure 4:
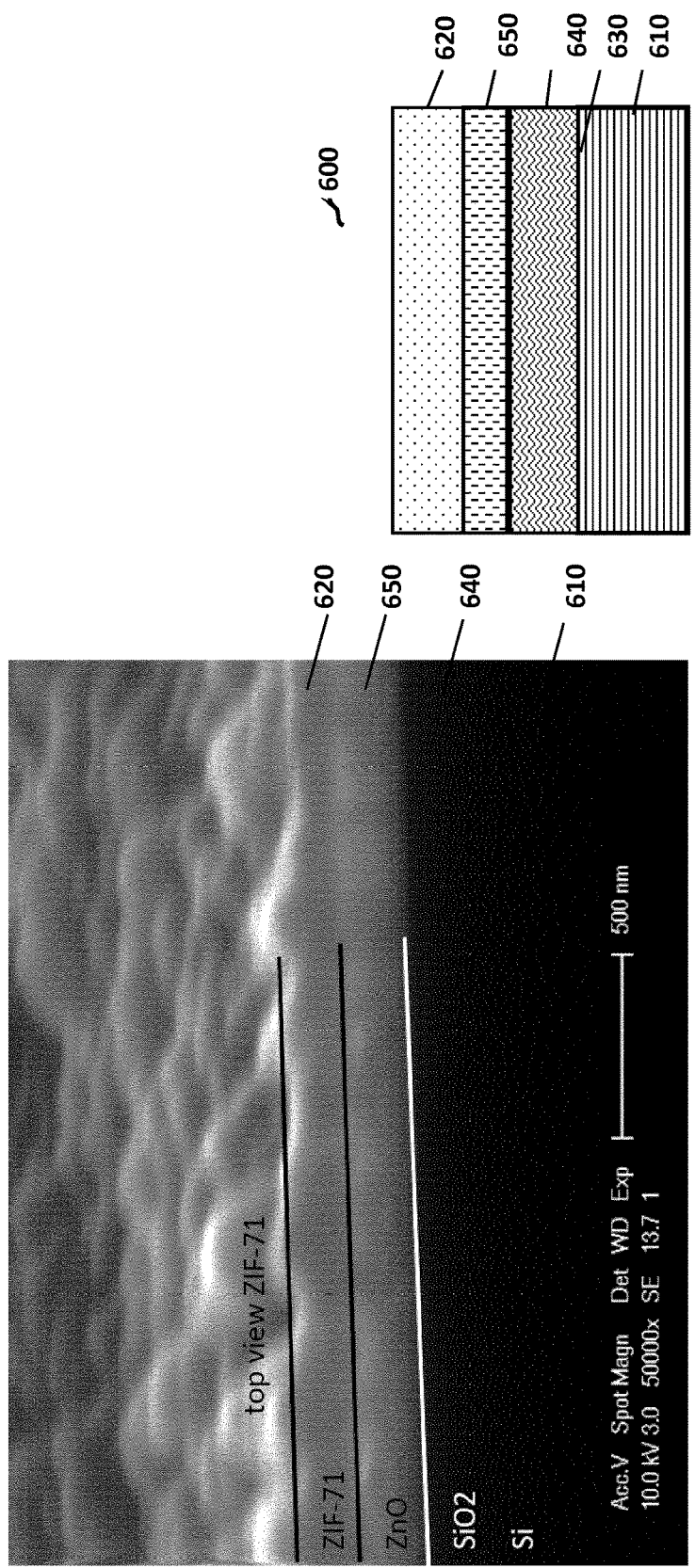

It is observed from FIG. 4 (a) that when an initial ZnO thickness of 25 nm is used, full conversion of ZnO into a MOF film (620) is obtained. The MOF film (620) shown in FIG. 4 (a) is a ZIF-8. Full conversion of ZnO into ZIF-8 is judged by the absence of a contrast difference between SiO$_2$(640) and ZIF-8 (620). This is also schematically illustrated in FIG. 4 (b).

In FIG. 4 (b), the substrate is denoted by 610. On the main surface (630) of the substrate an oxide is present (640). This oxide is SiO$_2$. The MOF film (620) is produced by full conversion of ZnO, such that the ZnO layer is not visible anymore and the obtained MOF film (620) is thus overlaying the oxide (640). It is advantageous to have SiO$_2$, such that when ZnO is fully converted to the MOF film, it acts as an adhesion layer between the substrate and the MOF film. However, in the case where the initial ZnO thickness is 320 nm, presence of unreacted ZnO (650), which is not converted to MOF film, is observed as shown in FIG. (c). Here the unreacted ZnO (650) film thickness is about 177 nm. The MOF film (620) shown in FIG. 4 (c) is ZIF-71. The contrast difference between SiO$_2$ (640) and ZIF-71 (620) reveals the presence of the unreacted ZnO (650). This is also schematically illustrated in FIG. (d), where the unreacted ZnO film is denoted by 650.

Figure 5:
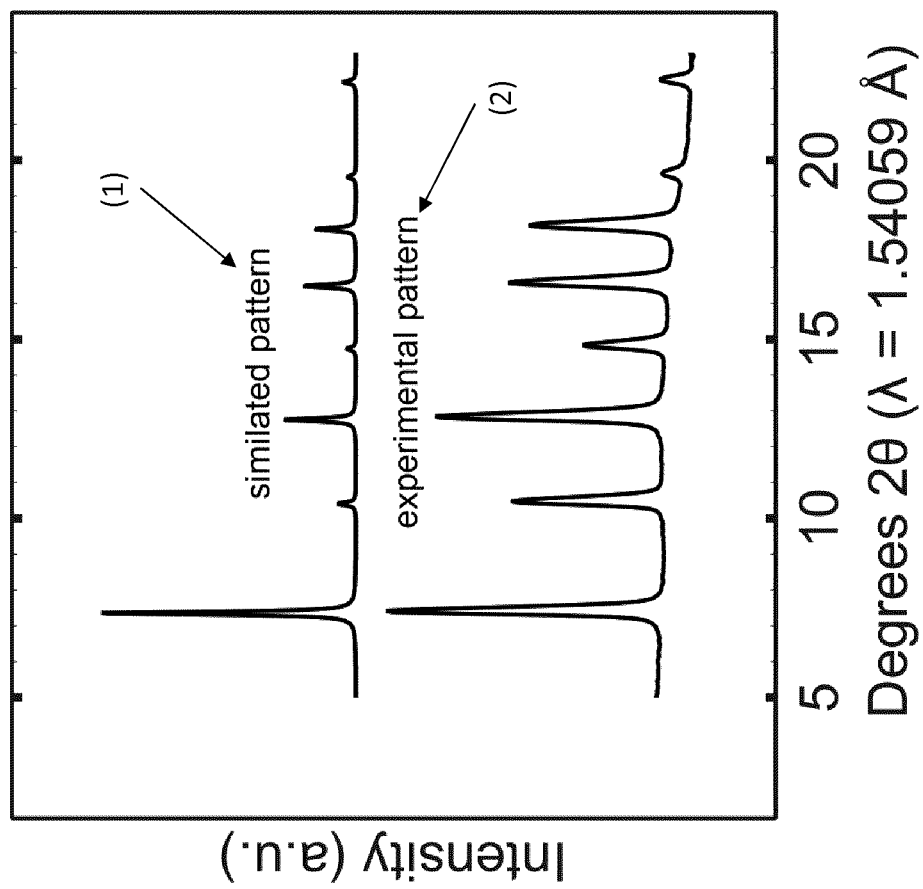
FIG. 5 shows X-Ray Diffraction spectra of ZIF-8 film (1) simulated pattern and (2) experimental pattern.

FIG. 5 shows the XRD spectra of this sample presented in FIG. 4(a). The simulated pattern (1) is a calculated XRD pattern using the crystal lattice information from a ZIF-8 Crystallographic Information File (CIF). The CIF for ZIF-8 is obtained from Exceptional chemical and thermal stability of zeolitic imidazolate frameworks; Proceedings of the National Academy of Sciences, 103(27), 10186-10191. The matching peaks between the simulated pattern (1) and the experimental pattern (2) confirm the formation of ZIF-8 film.

Figure 6:
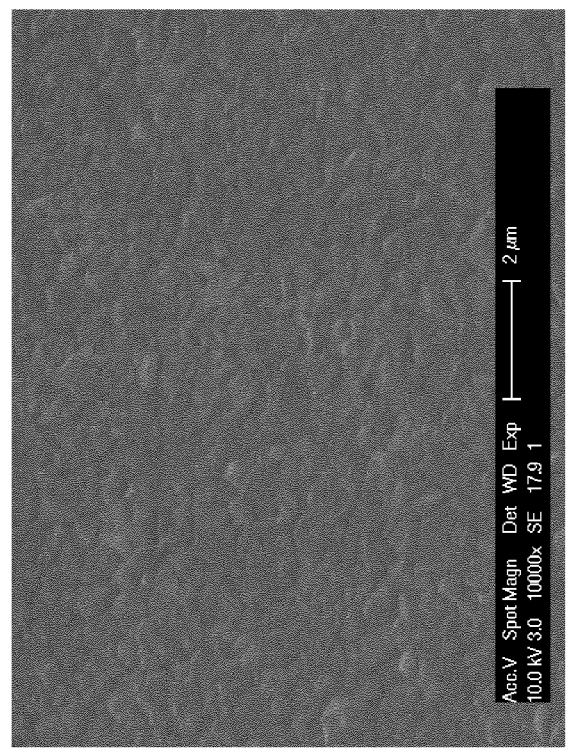
FIG. 6 is a top view of MOF film formed when (a) $SiO_2$ and (b) $TiO_2$ is used as adhesion layer on the main surface of the substrate.
Figure 6:
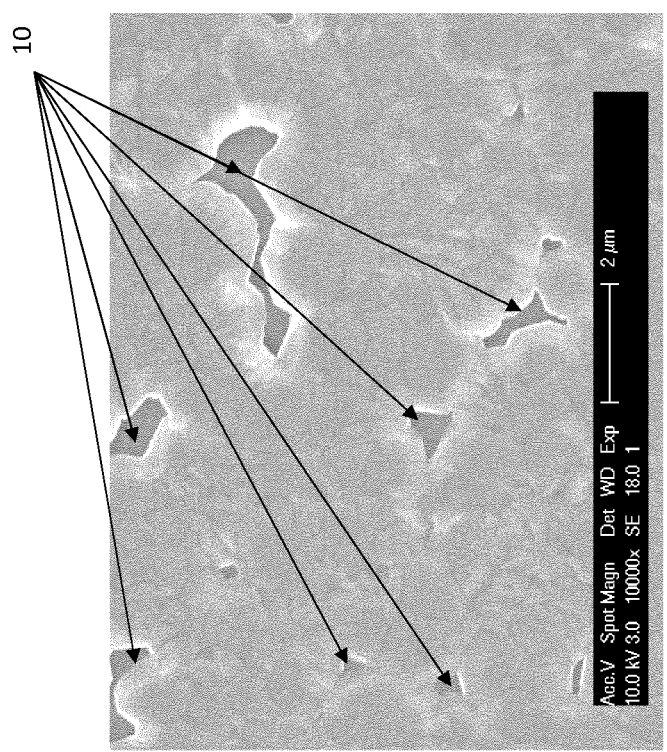

FIG. 6(a) and (b) compare the MOF film formed on metal oxide, where an adhesion layer is present on the main surface of the substrate. This adhesion layer in FIG. 6(a) is SiO$_2$ while it is TiO$_2$ in FIG. 6(b). The MOF film formed is ZIF-8. The metal oxide is ZnO, which is deposited on SiO$_2$ (FIG. 6(a)) or on TiO$_2$ (FIG. 6(b)), having a thickness of 10 nm. The substrate with the exposed ZnO has been subjected to 2-methylimidazole for 30 minutes at 100° C. under atmospheric pressure. Subsequently, a 5 minute purging under N2 atmosphere at 100° C. has been done. TiO$_2$ is provided on the main surface of the substrate by sputtering and it has a thickness of about 40 nm. SiO$_2$ is provided on the main surface of the substrate by chemical vapor deposition (CVD) and it has a thickness of about 100 nm.

It is observed that the type of the adhesion layer influences the continuity of the MOF film formed. While discontinuities (10) are present in ZIF-8 film when SiO$_2$ is used as the adhesion layer, a continuous ZIF-8 film is formed when TiO$_2$ is used as the adhesion layer.

The experimental details used to produce these two different MOF films are given in FIG. 7.

In a third embodiment, not shown in a separate figure, metal oxide can be formed by performing cyclic reaction sequence (102) done by ALD as shown in FIG. 3 for a first pre-determined number of cycle times that would correspond to a metal oxide thickness of, for example, less than or equal to 50 nm. Subsequently, the metal oxide is subjected to the organic ligand during one-step solid-vapour phase deposition process (500) to have a single cycle of MOF deposition. Repeating the single cycle for a second pre-determined number of cycle times is called a super-cycle.

Typically, the second pre-determined number of cycle times used to repeat the single cycle is given by the following formula:

$$\frac{1000}{\text{first pre-determined number of cycle times}} \quad (1)$$

This formula (1) is valid if no expansion takes place when converting the metal oxide to said MOF film. Theoretically, however, the second pre-determined number of cycle times used to repeat the single cycle depends on the expansion, which is in the range of 1 to 50. Therefore, in order to produce a MOF film having a thickness in the range of 5 nm to 250 nm, the second pre-determined number of times used to repeat the single cycle is given by the following formula, which also takes into account the expansion:

$$\frac{10}{\text{first pre-determined number of cycle times}} \quad (2)$$

Performing this super-cycle may be done by two alternatives. In a first alternative, the metal oxide that is formed by ALD in the cyclic reaction sequence (102) is fully converted into a MOF film upon subjecting it to the organic ligand (500) in vapor phase after each single cycle of MOF deposition. Repeating this single cycle of MOF deposition, thus forms a super-cycle. This first alternative is advantageous such that it leads to the formation of a MOF film, which is pin-hole free, continuous and homogeneous at any desired thickness.

In a second alternative, the metal oxide that is formed by ALD in the cyclic reaction sequence (102) is not fully converted into a MOF film. This can be achieved either by depositing a metal oxide having a thickness higher than the critical thickness or by adjusting the time of subjecting the organic ligand in vapor phase to the metal oxide when the metal oxide thickness is less than the critical thickness. Repeating this single cycle of MOF deposition, thus forms a super-cycle. This second alternative is advantageous such that it leads to the formation of a layered structure of metal oxide and MOF film, which then can find applicability in, for example, photonic sensing.

In a fourth embodiment, a substrate structure (600, 601) is obtained comprising a substrate (610) and a MOF film (620) as shown in FIG. 8.

The MOF film (620) is produced according to any of the previous embodiments.

In FIG. 8(*a*) a substrate structure is schematically shown without the presence of the layer of the dielectric material (640) on the main surface (630) of the substrate. A substrate structure in the absence of this layer of this dielectric material can be advantageous if the MOF film is formed without converting the ZnO film fully. When the conversion of ZnO film is not full, ZnO film remains in between the substrate and the MOF film formed. This remaining ZnO film (not shown in FIG. 8(*a*)) can also act as an adhesion layer between the substrate and the MOF film.

In FIG. 8(*b*), a substrate structure having a adhesion layer (640) on the main surface (630) of the substrate (610) is schematically shown. In such an example of a substrate structure the MOF film may be formed by full conversion of ZnO. Alternatively, (not shown in FIG. 8(*b*)), the MOF film may be formed by partial conversion of ZnO. This results in an unconverted ZnO film (not shown in FIG. 8(*b*)) between the adhesion layer (640) and the MOF film (620) that is formed.

Envisioned applications

A method according to embodiments of the present invention allows to produce a MOF film by providing precursors in vapor phase. Furthermore, the method enables to obtain a self-limiting film deposition, thereby obtaining a homogeneous and pin-hole-free MOF film, even at thicknesses in the range 1nm to 250nm. Such a method of producing MOF film is particularly suited for the semiconductor industry. Thanks to its porous structure and low dielectric constant value, the MOF film can be used as inter-dielectric or intra-dielectric material in Back End Of Line (BEOL). In BEOL, the dielectric constant value of the inter-dielectric or intra-dielectric material is preferably less than the dielectric constant value of $SiO_2$, which is 4.0, in order to reduce the RC (resistance-capacitance) delay.

The method described above may also be particularly suited for coating sensors with a MOF film. A MOF film has an uniform size of molecular dimension and pore interiors that can be functionalized. Therefore, selective recognition of molecules is possible Furthermore, having a thin MOF film deposited by the methods disclosed, makes it suitable for integration with MEMS fabrication processes.

The method of producing the MOF film according to embodiments of this invention makes it advantageous to produce and/or to use MOF films in microelectronics applications.

The method described above may also be particularly suited for (photo)catalysts. Thin and uniform layers provide increased accessibility of catalytic sites.

The method described above may also be suited for (photo) electrochemical cells.

Yet another application suitable for using MOF films produced by the method described above is in the field of photonic sensing. Stacks of MOF layers alternating with high-refractive index materials can be produced for photonic sensing.

The invention claimed is:

1. A method of producing a metal organic framework (MOF) film on a substrate, the method comprising:
   providing a substrate having a main surface; and
   forming on said main surface a MOF film using an organometallic compound precursor, selected to form an organometallic compound, and at least one organic ligand,
   wherein each of said organometallic compound precursor and said at least one organic ligand is provided in vapor phase.

2. The method according to claim 1, wherein said main surface further comprises a conformal layer of a dielectric material.

3. The method according to claim 1, wherein said forming of said MOF film comprises initiating at least a cyclic reaction sequence repeatedly by exposing said main surface to said organometallic compound precursor, thereby depositing said organometallic compound on the exposed surface, and wherein said cyclic reaction sequence is repeated for a first pre-determined number of cycle times ranging between 1 to 100.

4. The method according to claim 3, wherein said first predetermined number of cycle times ranges between 1 to 20.

5. The method according to claim 3, wherein said cyclic reaction sequence uses a Molecular Layer Deposition (MLD) process, and wherein said cyclic reaction sequence comprises:
   performing a first purge step to remove unreacted organometallic compound precursor;
   subjecting said exposed main surface to said at least one organic ligand; and
   performing a second purge step to remove unreacted organic ligand.

6. The method according to claim 3, wherein said cyclic reaction sequence uses an Atomic Layer Deposition (ALD) process, and wherein said cyclic reaction sequence comprises:
   performing a first purge step to remove unreacted organometallic compound precursor;
   subjecting said exposed main surface to an oxidizing agent, thereby forming a metal oxide on said substrate;
   performing a second purge step to remove unreacted oxidizing agent; and subjecting said metal oxide to said at least one organic ligand for a predetermined duration involving a one-step solid vapour deposition process thereby at least partially converting said metal oxide into said MOF film.

7. The method according to claim 6, wherein said predetermined duration is determined to provide full conversion of said metal oxide into said MOF film.

8. The method according to claim 6, wherein said predetermined duration is determined to provide only partial conversion of said metal oxide into said MOF film.

9. The method according to claim 6, wherein said metal oxide is ZnO.

10. The method according to claim 6, wherein the cyclic reaction sequence of forming said metal oxide and the subsequent subjection of said metal oxide to said at least one organic ligand is repeated for a second predetermined number of cycle times to produce said MOF film with a predetermined thickness.

11. The method according to claim 1, wherein said organometallic compound precursor comprises a metal ion or a cluster of metal ions selected from a group consisting of Zn, Fe, In, Co, Cu, Mn, Li, B, Cd, Hg and Pr.

12. The method according to claim 1, wherein said organometallic compound precursor comprises a metal ion or a cluster of metal ions selected from a group consisting of Mg, Al, Zr, Hf, Ti and Ta.

13. The method according to claim 1, wherein said at least one organic ligand is an azole-based organic ligand selected from the group consisting of 2-methylimidazole, 3-(2-pyridyl)-5-(4-pyridyl-1,2,4-triazole or 4,5-dichloroimidazole.

14. The method according to claim 1, wherein each of said organometallic compound precursor and said at least one organic ligand is provided in a vapor phase.

15. The method according to claim 1, wherein prior to said forming, further comprising pre-conditioning said main surface of said substrate.

16. The method according to claim 15, wherein said pre-conditioning step comprises oxidizing said main surface of said substrate.

17. The method according to claim 16, wherein said oxidizing comprises exposing said main surface of said substrate to ozone or oxygen plasma.

18. The method according to claim 3, wherein said first predetermined number of cycle times ranges between 1 to 15.

19. The method according to claim 3, wherein said first predetermined number of cycle times ranges between 1 to 5.

* * * * *